United States Patent
Wang

(10) Patent No.: US 8,742,847 B1
(45) Date of Patent: Jun. 3, 2014

(54) AMPLIFIER AND DYNAMIC-BIAS GENERATION DEVICE AND DYNAMIC-BIAS METHOD THEREOF

(71) Applicant: Himax Technologies Limited, Tainan (TW)

(72) Inventor: Jia-Hui Wang, Tainan (TW)

(73) Assignee: Himax Technologies Limited, Tainan (TW)

(*) Notice: Subject to any disclaimer, the term of this patent is extended or adjusted under 35 U.S.C. 154(b) by 8 days.

(21) Appl. No.: 13/737,397

(22) Filed: Jan. 9, 2013

(51) Int. Cl.
*H03F 3/45* (2006.01)

(52) U.S. Cl.
USPC .......................... 330/258; 330/261; 330/255

(58) Field of Classification Search
USPC ................................................. 330/252–261
See application file for complete search history.

(56) References Cited

U.S. PATENT DOCUMENTS 7,135,927 B2 * 11/2006 Parkhurst ...................... 330/255
7,532,072 B1 * 5/2009 Tavakoli Dastjerdi et al. ............................ 330/258

* cited by examiner

*Primary Examiner* — Hieu Nguyen
(74) *Attorney, Agent, or Firm* — J.C. Patents

(57) ABSTRACT

An amplifier, a dynamic-bias generation device of the amplifier and a dynamic-bias method of the amplifier are provided. The dynamic-bias generation device comprises an input stage, an output stage, a detection unit, a dynamic-bias generation unit and a switch unit. The input stage having a plurality of bias terminals converts an input signal of the amplifier into at least one current signal according to the voltage of the bias terminals. The output stage receives and converts the current signal into an output signal of the amplifier. The detection unit detects the current signal. The dynamic-bias generation unit generates a plurality of bias voltages according to the current signal. The switch unit dynamically determines the connection relations between the bias voltages of the dynamic-bias generation unit and the bias terminals of the input stage according to the detection result of the detection unit.

13 Claims, 5 Drawing Sheets

AMPLIFIER AND DYNAMIC-BIAS GENERATION DEVICE AND DYNAMIC-BIAS METHOD THEREOF

BACKGROUND OF THE INVENTION

1. Field of the Invention

The invention relates to an amplifier. Particularly, the invention relates to a dynamic-bias generation device and a dynamic-bias method of an amplifier.

2. Description of Related Art

An analog circuit block of a general source driving chip is mainly a digital-to-analog converter and an output buffer (amplifier), where the output buffer is mainly used to determine power consumption and a driving speed of the source driving chip.

In application of a portable electronic product, although a higher scan frequency can lead to a better dynamic image, a dynamic power is also increased. As the scan frequency increases, a time for charging and discharging the output buffer is shortened, so that driving capability thereof has to be enhanced to reach a faster charge and discharge efficiency. Generally, in order to enhance the driving capability of the output buffer, a static current thereof has to be increased, which may cause an obvious increase of power consumption to shorten a battery service life.

SUMMARY OF THE INVENTION

The invention is directed to a dynamic-bias method, and an amplifier and a dynamic-bias device using the same, by which the dynamic-bias generation device is used to detect an input stage of the amplifier, and voltages of bias terminals of the input stage are changed to increase a driving current according to a detection result, so as to dynamically enhance driving capability of the amplifier.

The invention provides an amplifier including an input stage, an output stage, a detection unit, a dynamic-bias generation unit and a switch unit. The input stage has a plurality of bias terminals, and converts an input signal of the amplifier into at least a current signal according to voltages of the bias terminals. The output stage is coupled to the input stage to receive the current signal, and converts the current signal into an output signal of the amplifier. The detection unit is coupled to the input stage, and detects the current signal. The dynamic-bias generation unit is coupled to the input stage, and generates a plurality of bias voltages according to the current signal. The switch unit is coupled between an output terminal of the dynamic-bias generation unit and the bias terminals of the input stage, and dynamically determines connection relations between the bias voltages of the dynamic-bias generation unit and the bias terminals of the input stage according to a detection result of the detection unit.

The invention provides a dynamic-bias generation device, which is configured to provide a plurality of bias voltages to an amplifier. The dynamic-bias generation device includes a detection unit, a dynamic-bias generation unit and a switch unit. The detection unit is coupled to an input stage of the amplifier, and detects a plurality of current signals output to an output stage of the amplifier from the input stage. The dynamic-bias generation unit is coupled to the input stage, and generates a plurality of bias voltages according to the current signals. The switch unit is coupled between an output terminal of the dynamic-bias generation unit and a plurality of bias terminals of the input stage, and dynamically determines connection relations between the bias voltages of the dynamic-bias generation unit and the bias terminals of the input stage according to a detection result of the detection unit.

The invention provides a dynamic-bias method for an amplifier. The amplifier has an input stage and an output stage. The input stage converts an input signal of the amplifier into a plurality of current signals according to voltages of a plurality of bias terminals. The output stage converts the received current signals into an output signal of the amplifier. The dynamic-bias method includes following steps. The current signals of the input stage are detected to obtain a detection result. A plurality of bias voltages is generated according to the current signals. Connection relations between the bias voltages and the bias terminals of the input stage are dynamically determined according to the detection result.

According to the above descriptions, the amplifier of the invention can change the voltages received by the bias terminals of the input stage to increase the driving current when the input signal is transited, so as to enhance the driving capability of the amplifier. Compared to a conventional method of increasing a static current to increase the driving current, in the invention, the bias voltages at the bias terminals of the input stage are changed only when the input signal is transited, by which power consumption is reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
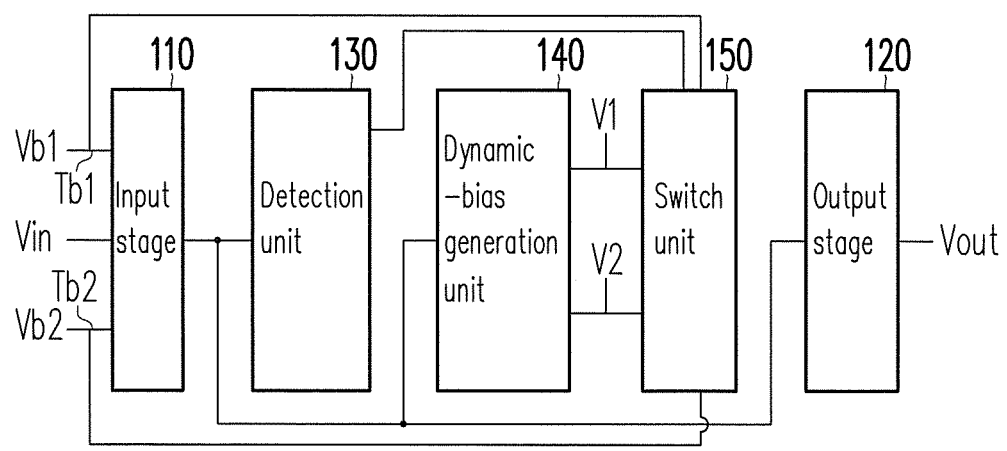
FIG. 1 is a functional block schematic diagram of an amplifier according to an embodiment of the invention.

FIG. 1 is a functional block schematic diagram of an amplifier 100 according to an embodiment of the invention. Referring to FIG. 1, the amplifier 100 includes an input stage 110, an output stage 120, a detection unit 130, a dynamic-bias generation unit 140 and a switch unit 150. The input stage 110 has a plurality of bias terminals (for example, Tb1 and Tb2) and an input terminal. The input terminal of the input stage is configured to receive an input voltage signal Vin. The input stage 110 converts the input signal Vin into a current signal for outputting according to voltages Vb1 and Vb2 of the bias terminals Tb1 and Tb2. The output stage 120 is coupled to the input stage 110 to receive the current signal of the input stage 110, and converts the current signal into an output signal Vout for outputting. The detection unit 130 is coupled to the input stage 110, and detects the current signal output by the input stage 110, and transmits a detection result to the switch unit 150. The dynamic-bias generation unit 140 is coupled to the input stage 110, and receives the current signal output by the input stage 110. The dynamic-bias generation unit 140 generates bias voltages V1 and V2 according to the current signal. The switch unit 150 is coupled to output terminals of the dynamic-bias generation unit 140 for receiving the bias voltages V1 and V2. The switch unit 150 is also coupled to the bias terminals Tb1 and Tb2 of the input stage 110, and provides the bias voltages V1 and V2 to the bias terminals Tb1 and Tb2. The switch unit 150 is also coupled to the detection unit 130 for receiving the detection result. The switch unit 150 determines connection relations between the bias voltages V1 and V2 and the bias terminals Tb1 and Tb2 of the input stage 110 according to the detection result of the detection unit 130.

When the input signal Vin is in a stable state, the dynamic-bias generation unit 140 and the switch unit 150 control the amplifier 100 to operate in a low static state current mode. For example, when the input signal Vin is in a static state, the bias voltages V1 and V2 output by the dynamic-bias generation unit 140 are also in the static state. The bias voltages V1 and V2 are transmitted to the bias terminals Tb1 and Tb2 through the switch unit 150. For example, the switch unit 150 transmits the bias voltage V1 to the bias terminal Tb1 of the input stage 110, and transmits the bias voltage V2 to the bias terminal Tb2 of the input stage 110. The bias voltages V1 and V2 in the static state result in a fact that the input stage of the amplifier 100 is in the low static state current mode.

When the input signal Vin is transited, the dynamic-bias generation unit 140 and the switch unit 150 control the amplifier 100 to operate in a high dynamic current mode. For example, when the input signal Vin is transited from a logic low level voltage to a logic high level voltage, or transited from the logic high level voltage to the logic low level voltage (i.e. the amplifier 100 is in a charge state or a discharge state), the bias voltage V1 and V2 generated by the dynamic-bias generation unit 140 are varied along with the current signal generated by the input stage 110. For example, the dynamic-bias generation unit 140 can temporarily pull up (or pull down) levels of the bias voltages V1 and V2. The dynamic-bias generation unit 140 transmits the bias voltages V1 and V2 to the switch unit 150.

On the other hand, the detection unit 130 detects whether the amplifier 100 is in the charge state or the discharge state according to the current signal generated by the input stage 110, and outputs the detection result to the switch unit 150. The switch unit 150 switches the connections between the bias voltages V1 and V2 and the bias terminals Tb1 and Tb2 of the input stage 110 according to the detection result of the detection unit 130. For example, the switch unit 150 can transmit a positive pulse of the bias voltage V1 to the bias terminal Tb1 of the input stage 110, and transmits a negative pulse of the bias voltage V2 to the bias terminal Tb2 of the input stage 110. For another example, the switch unit 150 can transmit a positive pulse of the bias voltage V2 to the bias terminal Tb1 of the input stage 110, and transmits a negative pulse of the bias voltage V1 to the bias terminal Tb2 of the input stage 110.

After the switching operation of the switch unit 150, regardless of whether the amplifier 100 is in the charge state or the discharge state, the bias voltages V1 and V2 generated by the dynamic-bias generation unit 140 can temporarily increase a driving current of the input stage 110, so that a speed that an output signal Vout output by the output stage 120 charges/discharges a load is increased. Therefore, regardless of whether the amplifier 100 is in the charge state or the discharge state, the driving current of the amplifier 100 can be increased due to dynamic adjustment of the bias voltages V1 and V2, so as to enhance the driving capability of the amplifier 100. After the input signal Vin is restored to the static state, the bias voltages V1 and V2 are restored to the static state levels, and the input stage 110 is restored to the low static state current mode, so as to reduce the power consumption of the amplifier 100.

Figure 2:
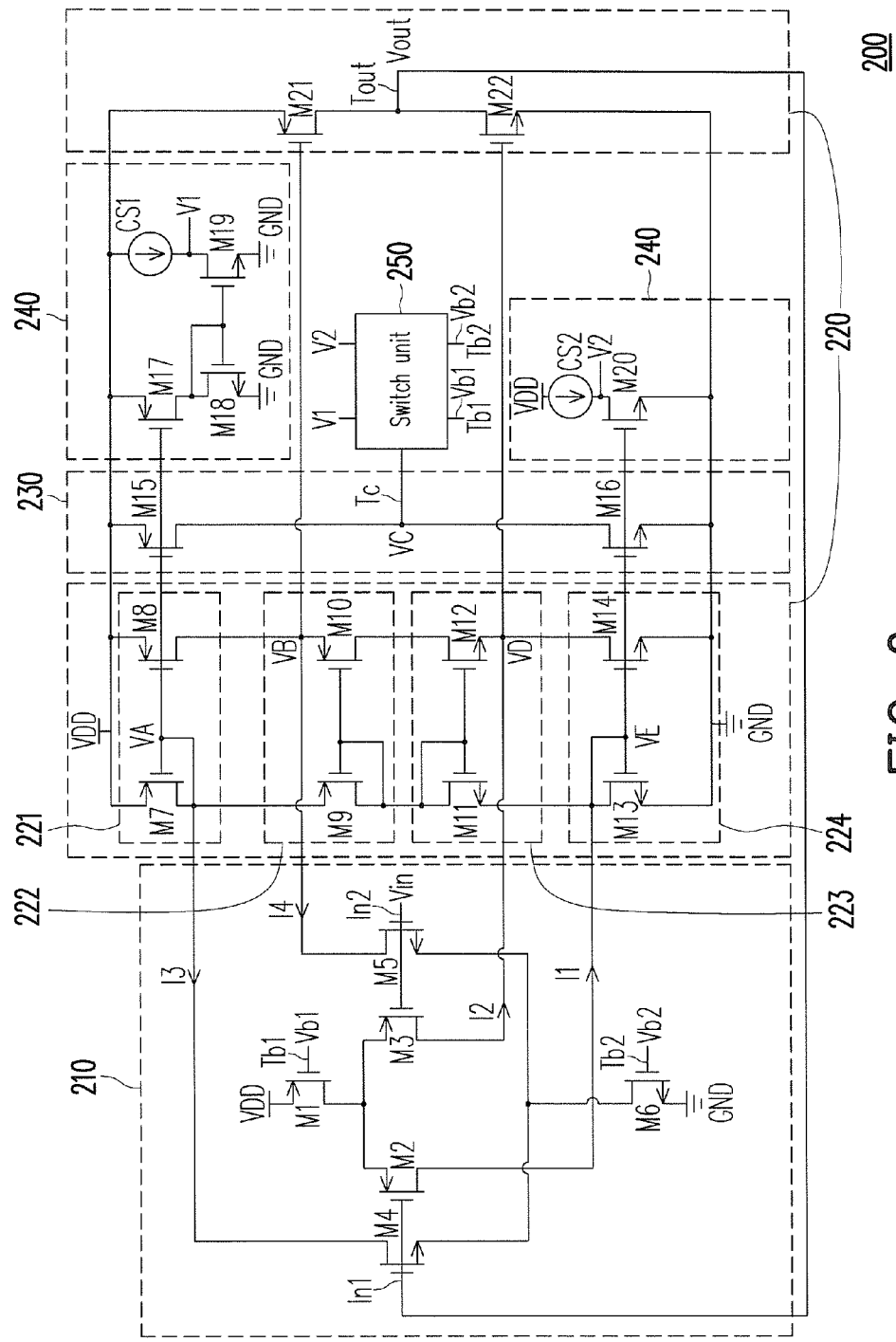
FIG. 2 is a circuit diagram of an amplifier according to another embodiment of the invention.

FIG. 2 is a circuit diagram of an amplifier 200 according to another embodiment of the invention. In FIG. 2, although a rail-to-rail output buffer is used to implement the amplifier 100, the invention is not limited thereto, and those skilled in the art can refer related descriptions of the embodiment of FIG. 2 to deduce the other types of amplifiers or buffers. Related descriptions of the amplifier 100 of FIG. 1 can be referred for the amplifier 200 of FIG. 2. Referring to FIG. 2, the amplifier 200 includes an input stage 210, an output stage 220, a detection unit 230, a dynamic-bias generation unit 240 and a switch unit 250. In the embodiment of FIG. 2, an output terminal Tout of the amplifier 200 is directly coupled to an input terminal In1 to serve as an output buffer or a unit gain amplifier, though the invention is not limited thereto.

Related descriptions of the input stage 110 of FIG. 1 can be referred for the input stage 210 of FIG. 2. The input stage 210 includes transistors M1-M6, where the transistors M1-M3 are P-channel metal oxide semiconductor (PMOS) transistors, and the transistors M4-M6 are N-channel metal oxide semiconductor (NMOS) transistors. A first terminal (for example, a source) of the transistor M1 is coupled to a first voltage (for example, the first voltage is a power voltage VDD in the present embodiment). A control terminal (for example, a gate) of the transistor M1 is coupled to the bias terminal Tb1 of the input stage 210. A first terminal (for example, a source) of the transistor M2 is coupled to a second terminal (for example, a drain) of the transistor M1. A second terminal (for example, a drain) of the transistor M2 is coupled to the output stage 220 for providing a current I1 of the current signal. A control terminal (for example, a gate) of the transistor M2 is coupled to the input terminal In1 of the input stage 210. A first terminal (for example, a source) of the transistor M3 is coupled to the drain of the transistor M1. A second terminal (for example, a drain) of the transistor M3 is coupled to the output stage 220 for providing a current I2 of the current signal. A control terminal (for example, a gate) of the transistor M3 is coupled to an input terminal In2 of the input stage 210 for receiving the input signal Vin.

A first terminal (for example, a drain) of the transistor M4 is coupled to the output stage 220 for providing a current I3 of the current signal. A control terminal (for example, a gate) of the transistor M4 is coupled to the input terminal In1 of the input stage 210 and the output terminal Tout of the amplifier 200. A first terminal (for example, a drain) of the transistor M5 is coupled to the output stage 220 for providing a current I4 of the current signal. A control terminal (for example, a gate) of the transistor M5 is coupled to the input terminal In2 of the input stage 210. A first terminal (for example, a drain) of the transistor M6 is coupled to a second terminal (for example, a source) of the transistor M4 and a second terminal (for example, a source) of the transistor M5. A second terminal (for example, a source) of the transistor M6 is coupled to a second voltage (for example, the second voltage is a ground voltage GND in the present embodiment). A control terminal (for example, a gate) of the transistor M6 is coupled to the bias terminal Tb2 of the input stage 210.

Related descriptions of the output stage 120 of FIG. 1 can be referred for the output stage 220 of FIG. 2. The output stage 220 includes a current mirror 221 composed of PMOS transistors M7 and M8, a current mirror 222 composed of PMOS transistors M9 and M10, a current mirror 223 composed of NMOS transistors M11 and M12, a current mirror 224 composed of NMOS transistors M13 and M14, a PMOS transistor M21 and an NMOS transistor M22.

A first master terminal and a first slave terminal of the current mirror 221 (sources of the transistor M7 and M8) are coupled to the power voltage VDD. A second master terminal of the current mirror 221 (a drain of the transistor M7) is coupled to the drain of the transistor M4. A second slave terminal of the current mirror 221 (a drain of the transistor M8) is coupled to the drain of the transistor M5.

A first master terminal of the current mirror 222 (a source of the transistor M9) is coupled to the drain of the transistor M7. A first slave terminal of the current mirror 222 (a source of the transistor M10) is coupled to the drain of the transistor M8.

A first master terminal of the current mirror 223 (a drain of the transistor M11) is coupled to a second master terminal of the current mirror 222 (a drain of the transistor M9). A first slave terminal of the current mirror 223 (a drain of the transistor M12) is coupled to a second slave terminal of the current mirror 222 (a drain of the transistor M10). A second master terminal of the current mirror 223 (a source of the transistor M11) is coupled to the drain of the transistor M2. A second slave terminal of the current mirror 223 (a source of the transistor M12) is coupled to the drain of the transistor M3.

A first master terminal of the current mirror 224 (a drain of the transistor M13) is coupled to the source of the transistor M11. A first slave terminal of the current mirror 224 (a drain of the transistor M14) is coupled to the source of the transistor M12. A second master terminal of the current mirror 224 (a source of the transistor M13) and a second slave terminal of the current mirror 224 (a source of the transistor M14) are coupled to the ground GND.

A first terminal (for example, a source) of the output transistor M21 is coupled to the power voltage VDD. A second terminal (for example, a drain) of the transistor M21 is coupled to the output terminal Tout of the amplifier 200 for providing the output signal Vout. A control terminal (for example, a gate) of the output transistor M21 is coupled to the drain of the transistor M8.

A first terminal (for example, a drain) of the output transistor M22 is coupled to the drain of the output transistor M21. A second terminal (for example, a source) of the output transistor M22 is coupled to the ground GND. A control terminal (for example, a gate) of the transistor M22 is coupled to the source of the transistor M12.

Related descriptions of the detection unit 130 of FIG. 1 can be referred for the detection unit 230 of FIG. 2. The detection unit 230 includes a PMOS transistor M15 and an NMOS transistor M16. A first terminal (for example, a source) of the detection transistor M15 is coupled to the power voltage VDD. A second terminal (for example, a drain) of the detection transistor M15 is coupled to a control terminal TC of the switch unit 250 for providing a detection result (i.e. a control voltage VC) of the detection unit 230. A control terminal (for example, a gate) of the detection transistor M15 is coupled to the drain of the transistor M4. A first terminal (for example, a drain) of the detection transistor M16 is coupled to the drain of the detection transistor M15. A second terminal (for example, a source) of the detection transistor M16 is coupled to the ground voltage GND. A control terminal (for example, a gate) of the detection transistor M16 is coupled to the drain of the transistor M2.

Related descriptions of the dynamic-bias generation unit 140 of FIG. 1 can be referred for the dynamic-bias generation unit 240 of FIG. 2. The dynamic-bias generation unit 240 includes a current source CS1, a current source CS2, a PMOS transistor M17, a current mirror composed of the NMOS transistors M18 and M19, and the NMOS transistor M20. A first terminal (for example, a source) of the bias transistor M17 is coupled to the power voltage VDD. A control terminal (for example, a gate) of the bias transistor M17 is coupled to the drain of the transistor M4. A first master terminal of the current mirror composed of the transistors M18 and M19 (a drain of the transistor M18) is coupled to a second terminal (for example, a drain) of the bias transistor M17. A first slave terminal of the current mirror composed of the transistors M18 and M19 (a drain of the transistor M19) is coupled to the current source CS1 for providing the bias voltage V1. A second master terminal and a second slave terminal of the current mirror composed of the transistors M18 and M19 (sources of the transistors M18 and M19) are coupled to the ground GND. A first terminal (for example, a drain) of the bias transistor M20 is coupled to the current source CS2 for providing the bias voltage V2. A control terminal (for example, a gate) of the bias transistor M20 is coupled to the drain of the transistor M2. A second terminal (for example, a source) of the bias transistor M20 is coupled to the ground GND.

Related descriptions of the switch unit 150 of FIG. 1 can be referred for the switch unit 250 of FIG. 2. The switch unit 250 receives the detection result of the detection unit 230 (i.e. the control voltage VC) through the control terminal TC, and determines connection relations between the bias voltages V1 and V2 of the dynamic-bias generation unit 240 and the bias terminals Tb1 and Tb2 of the input stage 210 according to the control voltage VC. For example, when the control voltage VC has a first logic state (for example, a high voltage level), the bias voltage V1 serves as the voltage Vb1, and is supplied to the bias terminal Tb1 of the input stage 210, and the bias voltage V2 serves as the voltage Vb2, and is supplied to the bias terminal Tb2 of the input stage 210. When the control voltage VC has a second logic state (for example, a low voltage level), the bias voltage V1 serves as the voltage Vb2, and is supplied to the bias terminal Tb2 of the input stage 210, and the bias voltage V2 serves as the voltage Vb1, and is supplied to the bias terminal Tb1 of the input stage 210. Any circuit that has the above operation behaviors can be used to implement the switch unit 250. For example, a circuit structure of FIG. 3 or a circuit structure of FIG. 4 can be referred for the circuit structure of the switch unit 250 of FIG. 2.

Figure 3:
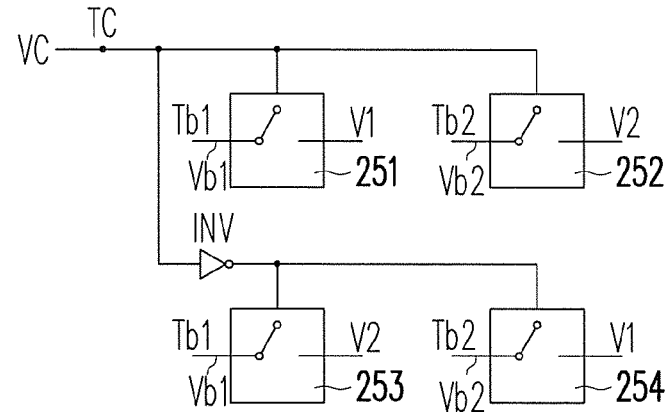
FIG. 3 is a circuit diagram of a switch unit of FIG. 2 according to an embodiment of the invention.

FIG. 3 is a circuit diagram of the switch unit 250 of FIG. 2 according to an embodiment of the invention. Referring to FIG. 3, the switch unit 250 includes switches 251-254 and an inverter INV. An input terminal of the inverter INV is coupled to the detection unit 230 for receiving the control voltage VC, and an output terminal of the inverter INV outputs an inverted signal of the control voltage VC.

A first terminal of the switch 251 is coupled to the dynamic-bias generation unit 240 for receiving the bias voltage V1. A second terminal of the switch 251 is coupled to the bias terminal Tb1 of the input stage 210 for providing the voltage Vb1. A control terminal of the switch 251 is coupled to the detection unit 230 for receiving the detection result (i.e. the control voltage VC). In the present embodiment, for example, when the control voltage VC has a logic high voltage level, the switch 251 is turned on, and the bias voltage V1 serves as the voltage Vb1 and is output to the bias terminal Tb1 of the input stage 210.

A first terminal of the switch 252 is coupled to the dynamic-bias generation unit 240 for receiving the bias voltage V2. A second terminal of the switch 252 is coupled to the bias terminal Tb2 of the input stage 210 for providing the voltage Vb2. A control terminal of the switch 252 is coupled to the detection unit 230 for receiving the detection result (i.e. the control voltage VC). In the present embodiment, for example, when the control voltage VC has the logic high voltage level, the switch 252 is turned on, and the bias voltage V2 serves as the voltage Vb2 and is output to the bias terminal Tb2 of the input stage 210.

A first terminal of the switch 253 is coupled to the dynamic-bias generation unit 240 for receiving the bias voltage V2. A second terminal of the switch 253 is coupled to the bias terminal Tb1 of the input stage 210 for providing the voltage Vb1. A control terminal of the switch 253 is coupled to an output terminal of the inverter INV for receiving the inverted signal of the control voltage VC. In the present embodiment, for example, when the inverted signal of the control voltage VC has the logic high voltage level (i.e. the control voltage VC has a logic low voltage level), the switch 253 is turned on, and the bias voltage V2 serves as the voltage Vb1 and is output to the bias terminal Tb1 of the input stage 210.

A first terminal of the switch 254 is coupled to the dynamic-bias generation unit 240 for receiving the bias voltage V1. A second terminal of the switch 254 is coupled to the bias terminal Tb2 of the input stage 210 for providing the voltage Vb2. A control terminal of the switch 253 is coupled to the output terminal of the inverter INV for receiving the inverted signal of the control voltage VC. In the present embodiment, for example, when the inverted signal of the control voltage VC has the logic high voltage level, the switch 254 is turned on, and the bias voltage V1 serves as the voltage Vb2 and is output to the bias terminal Tb2 of the input stage 210.

Figure 4:
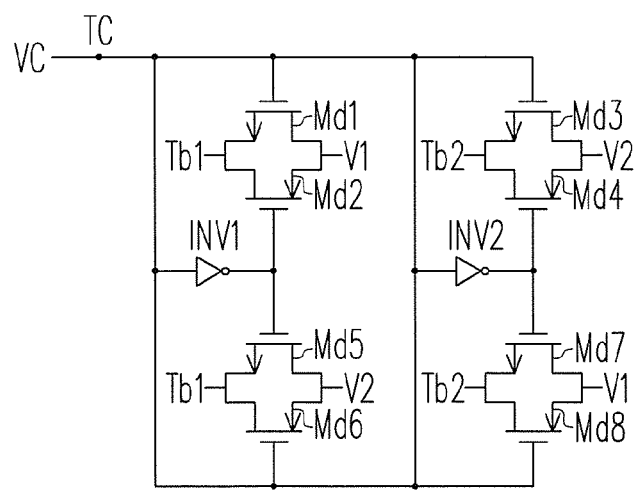
FIG. 4 is a circuit diagram of a switch unit of FIG. 2 according to an embodiment of the invention.

FIG. 4 is a circuit diagram of the switch unit 250 of FIG. 2 according to an embodiment of the invention. Referring to FIG. 4, the switch unit 250 includes an NMOS transistor Md1, an NMOS transistor Md3, an NMOS transistor Md5, an NMOS transistor Md7, a PMOS transistor Md2, a PMOS transistor Md4, a PMOS transistor Md6, a PMOS transistor Md8 and inverters INV1 and INV2. Input terminals of the inverters INV1 and INV2 are coupled to the detection unit 230 for receiving the detection result of the detection unit 230 (i.e. the control voltage VC), and output terminals of the inverters INV1 and INV2 output the inverted signal of the control voltage VC.

A drain of the transistor Md1 and a source of the transistor Md2 are coupled to the dynamic-bias generation unit 240 for receiving the bias voltage V1. A source of the transistor Md1 and a drain of the transistor Md2 are coupled to the bias terminal Tb1 of the input stage 210 for providing the voltage Vb1. A gate of the transistor Md1 is coupled to the detection unit 230 for receiving the detection result (i.e. the control voltage VC). A gate of the transistor Md2 is coupled to the output terminal of the inverter INV1 for receiving the inverted signal of the control voltage VC. Therefore, when the control voltage VC has the logic high voltage level, the transistors Md1 and Md2 are all turned on, and the bias voltage V1 serves as the voltage Vb1 for outputting to the bias terminal Tb1 of the input stage 210. When the control voltage VC has the logic low voltage level, the transistors Md1 and Md2 are all turned off.

A drain of the transistor Md3 and a source of the transistor Md4 are coupled to the dynamic-bias generation unit 240 for receiving the bias voltage V2. A source of the transistor Md3 and a drain of the transistor Md4 are coupled to the bias terminal Tb2 of the input stage 210 for providing the voltage Vb2. A gate of the transistor Md3 is coupled to the detection unit 230 for receiving the detection result (i.e. the control voltage VC). A gate of the transistor Md4 is coupled to the output terminal of the inverter INV2 for receiving the inverted signal of the control voltage VC. Therefore, when the control voltage VC has the logic high voltage level, the transistors Md3 and Md4 are all turned on, and the bias voltage V2 serves as the voltage Vb2 for outputting to the bias terminal Tb2 of the input stage 210. When the control voltage VC has the logic low voltage level, the transistors Md3 and Md4 are all turned off.

A drain of the transistor Md5 and a source of the transistor Md6 are coupled to the dynamic-bias generation unit 240 for receiving the bias voltage V2. A source of the transistor Md5 and a drain of the transistor Md6 are coupled to the bias terminal Tb1 of the input stage 210 for providing the voltage Vb1. A gate of the transistor Md6 is coupled to the detection unit 230 for receiving the detection result (i.e. the control voltage VC). A gate of the transistor Md5 is coupled to the output terminal of the inverter INV1 for receiving the inverted signal of the control voltage VC. Therefore, when the control voltage VC has the logic low voltage level, the transistors Md5 and Md6 are all turned on, and the bias voltage V2 serves as the voltage Vb1 for outputting to the bias terminal Tb1 of the input stage 210. When the control voltage VC has the logic high voltage level, the transistors Md5 and Md6 are all turned off.

A drain of the transistor Md7 and a source of the transistor Md8 are coupled to the dynamic-bias generation unit 240 for receiving the bias voltage V1. A source of the transistor Md7 and a drain of the transistor Md8 are coupled to the bias terminal Tb2 of the input stage 210 for providing the voltage Vb2. A gate of the transistor Md8 is coupled to the detection unit 230 for receiving the detection result (i.e. the control voltage VC). A gate of the transistor Md7 is coupled to the output terminal of the inverter INV2 for receiving the inverted signal of the control voltage VC. Therefore, when the control voltage VC has the logic low voltage level, the transistors Md7 and Md8 are all turned on, and the bias voltage V1 serves as the voltage Vb2 for outputting to the bias terminal Tb2 of the input stage 210. When the control voltage VC has the logic high voltage level, the transistors Md7 and Md8 are all turned off.

Figure 5:
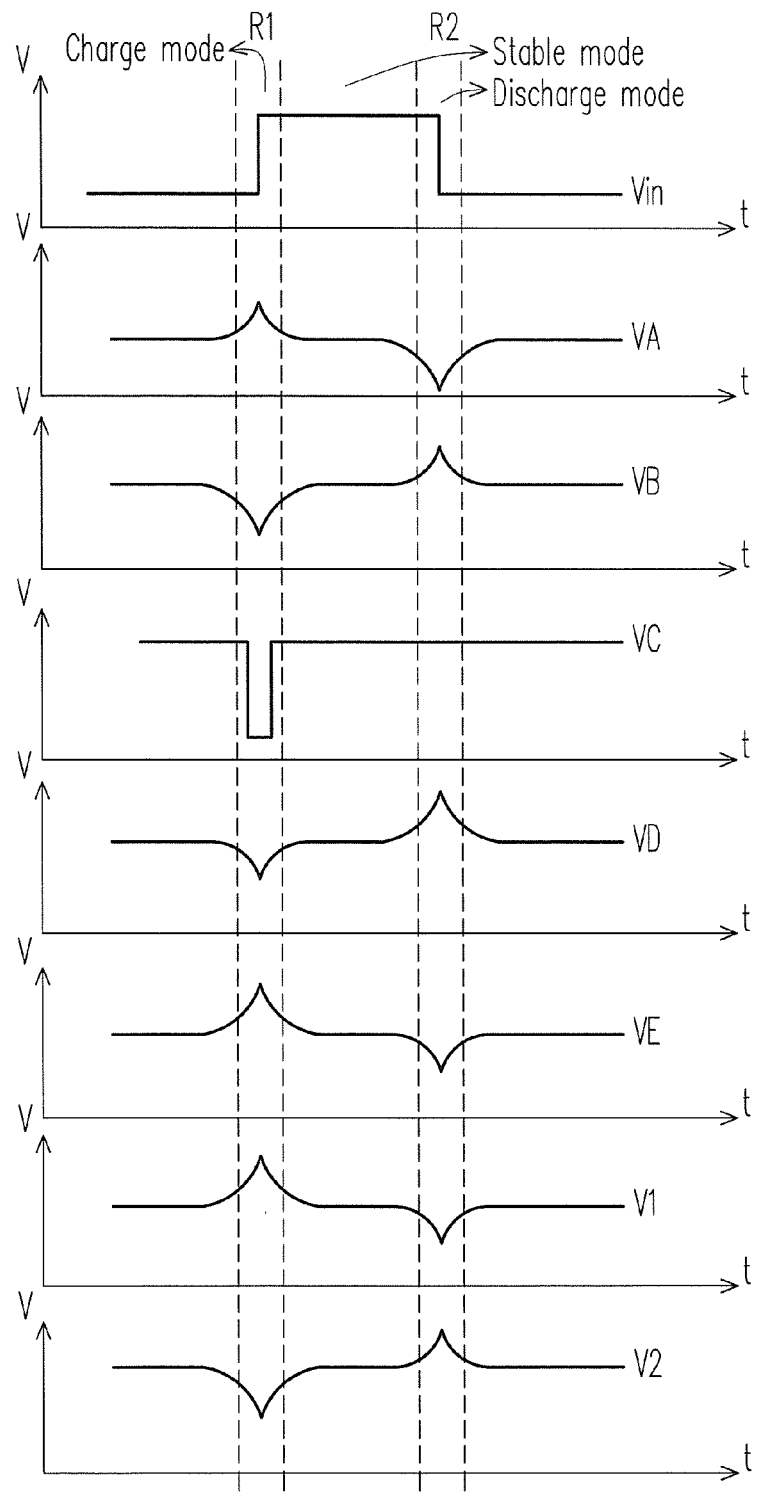
FIG. 5 is a schematic diagram illustrating node voltage variations of the amplifier of FIG. 2.

FIG. 5 is a schematic diagram illustrating node voltage variations of the amplifier 200 of FIG. 2. Referring to FIG. 2 and FIG. 5, in a charge region R1 of FIG. 5, when the input signal Vin is transited from the logic low level to the logic high level, the current I4 of the transistor M5 is increased as the voltage of the gate thereof increases. Since the current I4 is increased, the current I3 flowing through the transistor M4 is decreased, and the current of the transistor M7 is accordingly decreased. Since the current of the transistor M7 is decreased, a voltage difference between a voltage VA of the gate of the transistor M7 and the power voltage VDD is accordingly decreased, and the voltage VA is increased. The current of the transistor M8 is decreased as the voltage VA of the gate thereof increases, which represents that a strength that the transistor M8 pulls a voltage level of the drain thereof to the power voltage VDD is weakened, and a voltage VB of the drain of the transistor M8 is decreased. The decreased voltage VB turns on the transistor M21. On the other hand, the current of the transistor M17 is decreased as the voltage VA increases, which also decreases the currents of the transistor M18 and the transistor M19. Decrease of the current of the transistor M19 represents that a strength that the transistor M19 pulls a voltage level of the drain thereof to the ground voltage GND is weakened, so that the voltage of the drain of the transistor M19 (i.e. the bias voltage V1) is increased.

Meanwhile, the current I2 of the transistor M3 is decreased as the voltage of the gate thereof increases. Since the current I2 is decreased, the current I1 of the transistor M2 is increased, and the current flowing through the transistor M13 is accordingly increased. Increase of the current of the transistor M13 leads to increase of a voltage VE of the gate of the transistor M13, and the current of the transistor M14 is accordingly increased. Increase of the current of the transistor M14 represents that a strength that the transistor M14 pulls a voltage level of a voltage VD of the drain thereof to the ground voltage GND is enhanced, and the voltage VD is accordingly decreased. The decreased voltage VD turns off the transistor M22. On the other hand, the current of the transistor M20 is increased as the voltage VE increases, which represents that a strength that the transistor M20 pulls a voltage of the drain thereof to the ground voltage GND is enhanced, so that the voltage of the drain of the transistor M20 (i.e. the bias voltage V2) is decreased.

Now, the current of the transistor M15 is decreased as the voltage VA increases, and the current of the transistor M16 is increased as the voltage VE increases, so that the voltage level of the control voltage VC of the control terminal TC of the switch unit 250 is decreased due to discharge. As described above, when the control voltage VC has the logic low voltage level, the switch unit 250 outputs the bias voltage V1 to the bias terminal Tb2, and outputs the bias voltage V2 to the bias terminal Tb1. Now, the bias voltage V1 increases and the bias voltage V2 decreases, so that the currents of the transistor M1 and the transistor M6 are increased, and the driving capability of the amplifier 200 is enhanced.

Referring to a discharge region R2 of FIG. 5, when the input signal Vin is transited from the logic high level to the logic low level, the current I4 of the transistor M5 is decreased as the voltage of the gate thereof decreases. Since the current I4 is decreased, the current I3 flowing through the transistor M4 is increased, and the current of the transistor M7 is accordingly increased, and the voltage VA of the gate of the transistor M7 is decreased. Now, the current of the transistor M8 is increased as the voltage VA of the gate thereof decreases, which represents that the strength that the transistor M8 pulls the voltage level of the drain thereof to the power voltage VDD is enhanced, and the voltage VB is increased. The increased voltage VB turns off the transistor M21. On the other hand, the current of the transistor M17 is increased as the voltage VA decreases, and the current of the transistor M19 is accordingly increased, which represents that the strength that the transistor M19 pulls the voltage level of the drain thereof to the ground voltage GND is enhanced, so that the voltage of the drain of the transistor M19 (i.e. the bias voltage V1) is decreased.

Meanwhile, since the input signal Vin is transited to the logic low level, the current I2 is increased as the voltage of gate of the transistor M3 increases. Since the current I2 is increased, the current I1 of the transistor M2 is decreased, and the current flowing through the transistor M13 is accordingly decreased. Decrease of the current of the transistor M13 leads to decrease of a voltage VE of the gate of the transistor M13, and the current of the transistor M14 is accordingly decreased. Decrease of the current of the transistor M14 represents that the strength that the transistor M14 pulls the voltage level of the drain thereof to the ground voltage GND is weakened, and the voltage VD is accordingly increased. The increased voltage VD turns on the transistor M22. On the other hand, the current of the transistor M20 is decreased as the voltage VE decreases, which represents that the strength that the transistor M20 pulls the voltage of the drain thereof to the ground voltage GND is weakened, so that the voltage of the drain of the transistor M20 (i.e. the bias voltage V2) is increased.

Now, the current of the transistor M15 is increased as the voltage VA decreases, and the current of the transistor M16 is decreased as the voltage VE decreases, so that the voltage level of the control voltage VC of the control terminal TC of the switch unit 250 is increased due to charge. As described above, when the control voltage VC has the logic high voltage level, the bias voltage V1 is output to the bias terminal Tb1, and the bias voltage V2 is output to the bias terminal Tb2. Now, the bias voltage V1 decreases and the bias voltage V2 increases, so that the currents of the transistor M1 and the transistor M6 are increased, and the driving capability of the amplifier 200 is enhanced.

Moreover, when the input signal Vin is in a stable state, since a channel aspect ratio of the transistor M15 is larger than that of the transistors M7 and M8, and a channel aspect ratio of the transistor M16 is smaller than that of the transistors M13 and M14, the current flowing through the transistor M15 is greater than the current flowing through the transistor M16, and the control voltage VC is charged to the logic high voltage level. Therefore, when the input signal Vin is in the stable state, the switch unit 250 is maintained to a state of providing the bias voltage V1 to the bias terminal Td1 and providing the bias voltage V2 to the bias terminal Td2. Moreover, since the input signal Vin is in the stable state, the bias voltages V1 and V2 all have stable voltage levels, and the current of the amplifier 200 can be in an unchanged stable state (for example, a low static state current mode).

Figure 6:
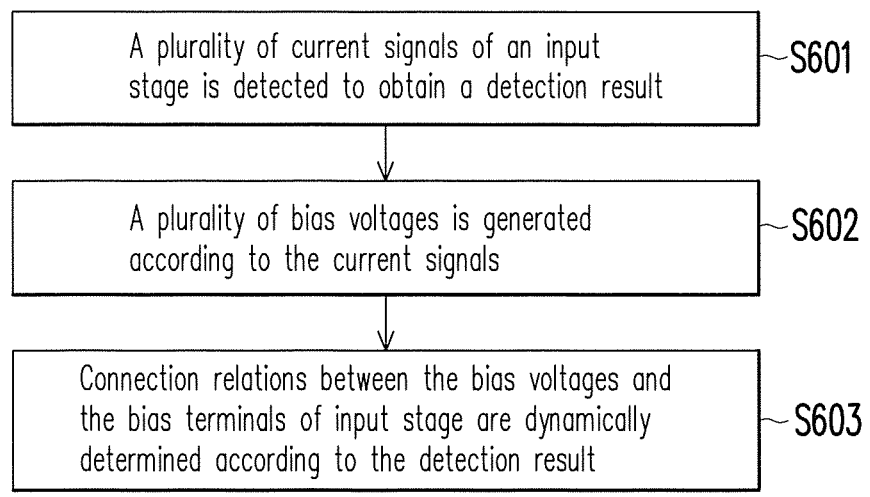
FIG. 6 is a flowchart illustrating a dynamic-bias method of an amplifier according to an embodiment of the invention.

FIG. 6 is a flowchart illustrating a dynamic-bias method of an amplifier according to an embodiment of the invention. The dynamic-bias method of the aforementioned embodiments is described below. The amplifier 100 (or 200) has the input stage 110 (or 210) and the output stage 120 (or 220). The input stage 110 (or 210) converts the input signal Vin into a plurality of current signals (for example, the currents I1 and I3) according to the voltages of a plurality of bias terminals (for example, the bias terminals Td1 and Td2). The output stage 120 (or 220) converts the current signals into the output signal Vout of the amplifier 100 (or 200). In step S601 of FIG. 6, a plurality of current signals (for example, the currents I1 and I3) of the input stage 110 (or 210) is detected to obtain a detection result. In step S602, a plurality of bias voltages (for example, the bias voltages V1 and V2) is generated according to the current signals. In step S602, connection relations between the bias voltages (for example, the bias voltages V1 and V2) and the bias terminals (for example, the bias terminals Td1 and Td2) of the input stage 110 are dynamically determined according to the detection result.

In summary, when the input signal is transited, the switch unit of the amplifier of the invention can change the voltages of the bias terminals of the input stage to increase the driving current by using the bias voltages varied along with the input signal. Therefore, regardless of whether the amplifier is in the charge state or the discharge state, the driving current of the amplifier is increased. When the input signal is in the static state, the switch unit can make the driving current of the amplifier to be in the low static state current mode. Compared to the conventional method of increasing a static current to increase the driving current, the amplifier and the dynamic-bias method of the invention can save power consumption.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An amplifier, comprising:
    an input stage, having a plurality of bias terminals, and converting an input signal of the amplifier into at least a current signal according to voltages of the bias terminals;
    an output stage, coupled to the input stage to receive the current signal, and converting the current signal into an output signal of the amplifier;
    a detection unit, coupled to the input stage, and detecting the current signal;
    a dynamic-bias generation unit, coupled to the input stage, and generating a plurality of bias voltages according to the current signal; and
    a switch unit, coupled between an output terminal of the dynamic-bias generation unit and the bias terminals of the input stage, and dynamically determining connection relations between the bias voltages of the dynamic-bias generation unit and the bias terminals of the input stage according to a detection result of the detection unit.

2. The amplifier as claimed in claim 1, wherein the dynamic-bias generation unit and the switch unit generate and adjust the voltages of the bias terminals of the input stage according to the detection result of the detection unit, so as to control the amplifier to operate in a low static state current mode when the input signal is in a stable state, and control the amplifier to operate in a high dynamic current mode when the input signal is transited.

3. The amplifier as claimed in claim 1, wherein the input stage comprises:
    a first transistor, having a first terminal coupled to a first voltage, and a control terminal coupled to a first bias terminal of the bias terminals of the input stage;
    a second transistor, having a first terminal coupled to a second terminal of the first transistor, a second terminal coupled to the output stage for providing a first current of the current signal, and a control terminal coupled to a first input terminal of the input stage;
    a third transistor, having a first terminal coupled to the second terminal of the first transistor, a second terminal coupled to the output stage for providing a second current of the current signal, and a control terminal coupled to a second input terminal of the input stage;
    a fourth transistor, having a first terminal coupled to the output stage for providing a third current of the current signal, and a control terminal coupled to the first input terminal of the input stage;
    a fifth transistor, having a first terminal coupled to the output stage for providing a fourth current of the current signal, and a control terminal coupled to the second input terminal of the input stage; and
    a sixth transistor, having a first terminal coupled to a second terminal of the fourth transistor and a second terminal of the fifth transistor, a second terminal coupled to a second voltage, and a control terminal coupled to a second bias terminal of the bias terminals of the input stage.

4. The amplifier as claimed in claim 3, wherein the output stage comprises:
    a first current mirror, having a first master terminal and a first slave terminal coupled to the first voltage, a second master terminal coupled to the first terminal of the fourth transistor, and a second slave terminal coupled to the first terminal of the fifth transistor;
    a second current mirror, having a first master terminal coupled to the second master terminal of the first current mirror, and a first slave terminal coupled to the second slave terminal of the first current mirror;
    a third current mirror, having a first master terminal coupled to a second master terminal of the second current mirror, a first slave terminal coupled to a second slave terminal of the second current mirror, a second master terminal coupled to the second terminal of the second transistor, and a second slave terminal coupled to the second terminal of the third transistor;
    a fourth current mirror, having a first master terminal coupled to the second master terminal of the third current mirror, a first slave terminal coupled to the second slave terminal of the third current mirror, and a second master terminal and a second slave terminal coupled to the second voltage;
    a first output transistor, having a first terminal coupled to the first voltage, a second terminal coupled to an output terminal of the amplifier for providing the output signal, and a control terminal coupled to the second slave terminal of the first current mirror; and
    a second output transistor, having a first terminal coupled to the second terminal of the first output transistor, a second terminal coupled to the second voltage, and a control terminal coupled to the second slave terminal of the third current mirror.

5. The amplifier as claimed in claim 3, wherein the detection unit comprises:
    a first detection transistor, having a first terminal coupled to the first voltage, a second terminal coupled to a control terminal of the switch unit for providing the detection result of the detection unit, and a control terminal coupled to the first terminal of the fourth transistor; and
    a second detection transistor, having a first terminal coupled to the second terminal of the first detection transistor, a second terminal coupled to the second voltage, and a control terminal coupled to the second terminal of the second transistor.

6. The amplifier as claimed in claim 3, wherein the dynamic-bias generation unit comprises:
    a first current source;
    a second current source;
    a first bias transistor, having a first terminal coupled to the first voltage, and a control terminal coupled to the first terminal of the fourth transistor;
    a current mirror, wherein a first master terminal of the current mirror is coupled to a second terminal of the first bias transistor, a first slave terminal of the current mirror is coupled to the first current source for providing a first bias voltage of the bias voltages, and a second master terminal and a second slave terminal of the current mirror are coupled to the second voltage; and
    a second bias transistor, having a first terminal coupled to the second current source for providing a second bias voltage of the bias voltages, a second terminal coupled to the second voltage, and a control terminal coupled to the second terminal of the second transistor.

7. The amplifier as claimed in claim 3, wherein the switch unit comprises:
    an inverter, having an input terminal coupled to the detection unit for receiving the detection result of the detection unit, and outputting an inverted signal of the detection result;
    a first switch, having a first terminal coupled to the dynamic-bias generation unit for receiving a first bias voltage of the bias voltages, a second terminal coupled to the first bias terminal of the bias terminals of the input stage, and a control terminal coupled to the detection unit for receiving the detection result of the detection unit;

a second switch, having a first terminal coupled to the dynamic-bias generation unit for receiving a second bias voltage of the bias voltages, a second terminal coupled to the second bias terminal of the bias terminals of the input stage, and a control terminal coupled to the detection unit for receiving the detection result of the detection unit;

a third switch, having a first terminal coupled to the dynamic-bias generation unit for receiving the second bias voltage, a second terminal coupled to the first bias terminal of the input stage, and a control terminal coupled to an output terminal of the inverter for receiving the inverted signal of the detection result of the detection unit; and a fourth switch, having a first terminal coupled to the dynamic-bias generation unit for receiving the first bias voltage, a second terminal coupled to the second bias terminal of the input stage, and a control terminal coupled to the output terminal of the inverter for receiving the inverted signal of the detection result of the detection unit.

8. A dynamic-bias generation device, configured to provide a plurality of bias voltages to an amplifier, the dynamic-bias generation device comprising:

a detection unit, coupled to an input stage of the amplifier, and detecting a plurality of current signals output to an output stage of the amplifier from the input stage;

a dynamic-bias generation unit, coupled to the input stage, and generating a plurality of bias voltages according to the current signals; and a switch unit, coupled between an output terminal of the dynamic-bias generation unit and a plurality of bias terminals of the input stage, and dynamically determining connection relations between the bias voltages of the dynamic-bias generation unit and the bias terminals of the input stage according to a detection result of the detection unit.

9. The dynamic-bias generation device as claimed in claim 8, wherein the dynamic-bias generation unit and the switch unit generate and adjust the voltages of the bias terminals of the input stage according to the detection result of the detection unit, so as to control the amplifier to operate in a low static state current mode when the input signal is in a stable state, and control the amplifier to operate in a high dynamic current mode when the input signal is transited.

10. The dynamic-bias generation device as claimed in claim 8, wherein the detection unit comprises:

a first detection transistor, having a first terminal coupled to a first voltage, a second terminal coupled to a control terminal of the switch unit for providing the detection result of the detection unit, and a control terminal coupled to the input stage for detecting one of the current signals; and a second detection transistor, having a first terminal coupled to the second terminal of the first detection transistor, a second terminal coupled to a second voltage, and a control terminal coupled to the input stage for detecting another one of the current signals.

11. The dynamic-bias generation device as claimed in claim 8, wherein the dynamic-bias generation unit comprises:

a first current source;
a second current source;

a first bias transistor, having a first terminal coupled to a first voltage, and a control terminal coupled to the input stage for detecting one of the current signals;

a current mirror, wherein a first master terminal of the current mirror is coupled to a second terminal of the first bias transistor, a first slave terminal of the current mirror is coupled to the first current source for providing a first bias voltage of the bias voltages, and a second master terminal and a second slave terminal of the current mirror are coupled to a second voltage; and a second bias transistor, having a first terminal coupled to the second current source for providing a second bias voltage of the bias voltages, a second terminal coupled to the second voltage, and a control terminal coupled to the input stage for detecting another one of the current signals.

12. The dynamic-bias generation device as claimed in claim 8, wherein the switch unit comprises:

an inverter, having an input terminal coupled to the detection unit for receiving the detection result of the detection unit, and outputting an inverted signal of the detection result;

a first switch, having a first terminal coupled to the dynamic-bias generation unit for receiving a first bias voltage of the bias voltages, a second terminal coupled to a first bias terminal of the bias terminals of the input stage, and a control terminal coupled to the detection unit for receiving the detection result of the detection unit;

a second switch, having a first terminal coupled to the dynamic-bias generation unit for receiving a second bias voltage of the bias voltages, a second terminal coupled to a second bias terminal of the bias terminals of the input stage, and a control terminal coupled to the detection unit for receiving the detection result of the detection unit;

a third switch, having a first terminal coupled to the dynamic-bias generation unit for receiving the second bias voltage, a second terminal coupled to the first bias terminal of the input stage, and a control terminal coupled to an output terminal of the inverter for receiving the inverted signal of the detection result of the detection unit; and a fourth switch, having a first terminal coupled to the dynamic-bias generation unit for receiving the first bias voltage, a second terminal coupled to the second bias terminal of the input stage, and a control terminal coupled to the output terminal of the inverter for receiving the inverted signal of the detection result of the detection unit.

13. A dynamic-bias method for an amplifier, wherein the amplifier has an input stage and an output stage, the input stage converts an input signal of the amplifier into a plurality of current signals according to voltages of a plurality of bias terminals, and the output stage converts the received current signals into an output signal of the amplifier, the dynamic-bias method comprising:

detecting the current signals of the input stage to obtain a detection result;

generating a plurality of bias voltages according to the current signals; and dynamically determining connection relations between the bias voltages and the bias terminals of the input stage according to the detection result.

* * * * *